United States Patent
Ohkawara et al.

[11] Patent Number: 5,881,888
[45] Date of Patent: Mar. 16, 1999

[54] WAFER DIE PICK-UP METHOD

[75] Inventors: Masaki Ohkawara, Sayama; Nobuyuki Aoyagi, Fussa, both of Japan

[73] Assignee: Kabushiki Kaisha Shinkawa, Tokyo, Japan

[21] Appl. No.: 734,865

[22] Filed: Oct. 23, 1996

[30] Foreign Application Priority Data

Oct. 23, 1995 [JP] Japan .................................. 7-299189

[51] Int. Cl.[6] .................................................. B07C 5/00
[52] U.S. Cl. .......................................... 209/552; 209/571
[58] Field of Search ................... 209/552, 559, 209/563, 564, 571, 573

[56] References Cited

U.S. PATENT DOCUMENTS

| | | | |
|---|---|---|---|
| 3,583,561 | 6/1971 | Wiesler et al. | 209/571 X |
| 3,847,284 | 11/1974 | Wiesler et al. | 209/573 X |
| 5,648,728 | 7/1997 | Canella | 209/573 X |

FOREIGN PATENT DOCUMENTS

| | | | |
|---|---|---|---|
| 56-98835 | 8/1981 | Japan | H01L 21/58 |
| 3248115 | 10/1988 | Japan | 209/573 |
| 1-45221 | 10/1989 | Japan | H01L 21/58 |

*Primary Examiner*—Tuan N. Nguyen
*Attorney, Agent, or Firm*—Koda & Androlia

[57] ABSTRACT

In a method for detecting and picking up dies from a wafer, when a defective die is detected inside a predetermined reversing range defined on the wafer, the die detection and pick-up movement is shifted one pitch to the next row of dies so as to detect the first die of the next row. If the first die of the next row is not a defective die, the die detection and pick-up movement proceeds toward the edge of the wafer in the X direction and successively detects and picks up dies on that row. Then, when a defective die is detected on that row, the direction of the die detection and pick-up movement is reversed without picking up the defective die, so that the die located immediately at the inner side of the first die of that row is detected and picked up, and non-defective dies on that row are successively detected and picked up. If the first die on the next row described above is a defective die, then the die detection and pick-up movement proceeds in the reverse direction so that the dies on the that row are successively detected and picked up as long as they are not defective dies.

2 Claims, 2 Drawing Sheets

WAFER DIE PICK-UP METHOD

BACKGROUND OF THE INVENTION

1. Field of the Invention

The present invention relates to a method for picking up dies from a semiconductor wafer on which a plurality of dies are formed.

2. Prior Art

Generally, wafers have a round shape, and a plurality of dies which have a square shape are formed in longitudinal and lateral rows on such wafers. As a result, the edges of dies located in the peripheral area of the round wafer have a circular arc shape, and the prescribed die shape cannot be obtained in such dies. Thus, such dies are called defectively shaped dies. Furthermore, the dies near defectively shaped dies often do not have completely formed circuits. Such dies on which no complete circuits are formed are generally called "mirror dies", and these mirror dies are defective. Recently, therefore, there has been a tendency of dies deliberately not formed in the peripheral areas of the round wafers.

Conventionally known methods detect dies having a defective shape in the peripheral areas of a wafer are disclosed in, for example, Japanese Patent Application Laid-Open (Kokai) No. 56-98835.

In the method disclosed in this prior art, the external shapes of the dies are detected by a detecting device that is moved in a detecting direction; and when a defectively shaped die is detected, the detecting device is moved to the next row and reverses the direction of detection (i. e., the direction in which die pick-up proceeds) and continues the detection.

Another method is disclosed in Japanese Patent Application Publication (Kokoku) No. 1-45221. In this method, the detecting device is moved to the next row and reverses the direction of detection when no die has been detected several consecutive times from the circumference of the wafer.

The prior arts described above, however, in fact, do not detect mirror dies or dies resembling mirror dies (which contain defective circuits) in the peripheral areas of the wafer. Accordingly, when these techniques are used to detect mirror dies or dies resembling mirror dies, the number of times to detect dies increases, and there is a significant drop in productivity.

SUMMARY OF THE INVENTION

Accordingly, the object of the present invention is to provide a wafer die pick-up method in which the number of times to detect mirror dies (or dies resembling mirror dies) located in the peripheral areas of a wafer can be reduced, thus improving the productivity.

The object is accomplished by a unique method of the present invention for a wafer die pick-up method in which a plurality of dies formed in rows in a wafer are picked up one by one by a collet, and the unique method of the present invention involves:

- determining a reversing range from the outer edge of the wafer and a reversal die number, and
- successively detecting and picking up dies on an intended row of dies in accordance with a predetermined die detection and pick-up direction, and
- when a certain number of mirror dies or dies resembling mirror dies (collectively referred to as "defective die") that is equal to the predetermined reversal die number is detected inside the reversing range, the wafer is moved one pitch so that the first die on the next row of dies on the wafer is detected, and a. if the first die of such next row is found not to be a defective die, then dies on that row of dies are successively detected and picked up toward the outer edge of the wafer in accordance with the die detection and pick-up direction, then, when a certain number of defective dies that is equal to the predetermined reversal die number is detected, the die detection and pick-up direction is reversed and the die located immediately next to the inner side of the first-picked up die of such next row is detected and picked up, afterward, dies on such next row are successively detected and picked up by the movement in this reversed pick-up direction, and the wafer is moved one pitch toward the next row of dies to be picked up at the end of the row, and the first die of that row is detected; but b. if the first die of the next row is found to be a defective die, then the die detection and pick-up direction is reversed and dies on such next row are successively detected and picked up as long as they are not defective dies.

The object is accomplished by another unique method of the present invention for a die pick-up method in which a plurality of dies formed in rows on a round wafer are detected and picked up one by one by a collet, and in this second method, in furtherance to the first method described above, the diameter of the wafer and a pitch in the die detection and pick-up direction are additionally determined, and the method described below is additionally taken along with the method of the first method, that is:

in the middle portion of the wafer, the die detection and pick-up movement is merely shifted to the next row when the die detection and pick-up movement approaches the peripheral area of the wafer notwithstanding if the die in the peripheral area is a defective die or not; and after having shifted to the next row, the die detection and pick-up direction is reversed notwithstanding if the first die detected on such next row is a defective die or not.

DETAILED DESCRIPTION OF THE PREFERRED EMBODIMENTS

Figure 1:
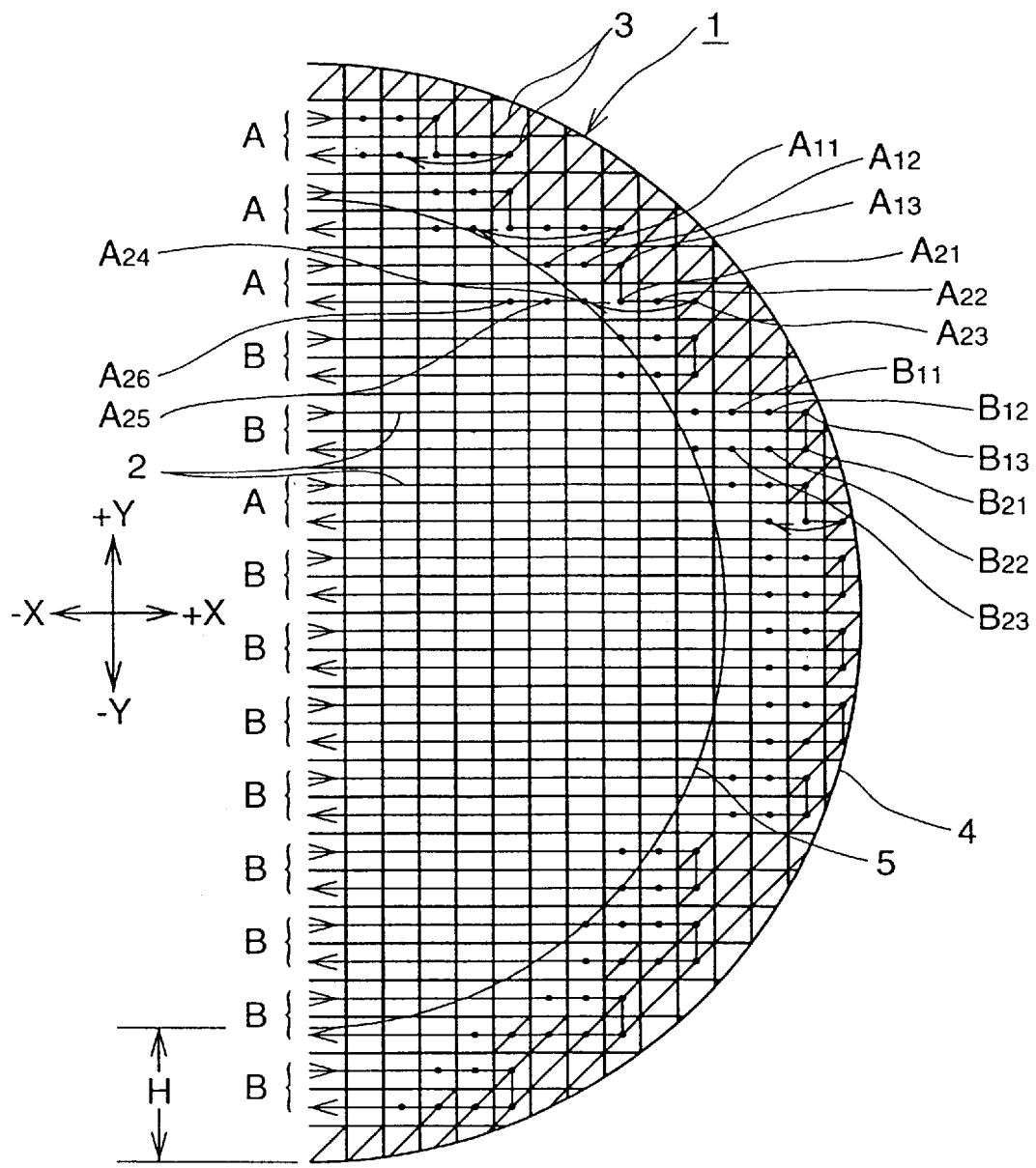
FIG. 1 is an explanatory plan view which illustrates a first embodiment of the wafer die pick-up method of the present invention.

A first embodiment of the present invention will be described with reference to FIG. 1. FIG. 1 illustrates a case in which the present invention is applied to a wafer which has mirror dies in its peripheral areas.

Dies 2 are formed by finely dividing the wafer 1 (only the right-side half thereof is shown) in the X direction (lateral direction) and Y direction (longitudinal direction). In FIG. 1, the dies marked with diagonal lines are mirror dies which have an incomplete circuit thereon, and a reversing area circle 5 (only the half thereof is shown) is defined on the wafer 1, that has an outer edge 4. The diameter of the reversing area circle 5 is smaller than the outer diameter of the wafer 1 by a distance H. This area defined by the distance H is a reversing area. The diameter or radius of the wafer and the reversing area defined by the distance H are determined and inputted in an operational control circuit (not shown) which moves the wafer 1 in the X and Y directions.

In this embodiment, two different detection and pick-up movement patterns A and B, in which dies on the wafer is successively detected and picked up, are established; and these detection and picked up movement patterns A and B are selected based upon the conditions which will be described below. In addition, whether a target die (which is detected and picked-up) is a mirror die on which no circuit or no complete circuit is formed or a normal die on which a circuit is formed completely is judged by processing the images that are obtained by a detection camera (not shown).

The detection and pick-up movement pattern A (called "pattern A") will be first described with reference to a case in which the die detection and pick-up begins from a point where the wafer 1 has been moved in the −X direction (or moved toward the left on the drawing sheet of FIG. 1), and the die 2 at position $A_{11}$ (called "die $2A_{11}$") is detected by the detection camera after the detection of the dies 2 located on the left side of the die $2A_{11}$ have been finished.

When the die $2A_{11}$, which is not a mirror die, is detected, the collet picks up the die $2A_{11}$. Each time one die is picked up, the wafer 1 is moved or shifted in the X direction by an amount equal to the pitch of the die. In other words, the detection camera successively detects dies 2 in the +X direction when the wafer is moved the distance equal to the width of each die. As a result, the die 2 at position $A_{12}$ ("die $2A_{12}$") is positioned directly beneath the detection camera and picked up by collet in the same manner that the die $2A_{11}$ is detected and picked up.

This operation is the same as that of a conventional device. However, in the present invention:

when the die at position $A_{13}$, which is next to the die $2A_{12}$, is detected and picked up, since this die at position $A_{13}$ is a mirror die ("die $3A_{13}$") and is inside the reversing area H, the wafer 1 is moved in the +Y direction to the next row which is one pitch down in the −Y direction, and the die 2 at position $A_{21}$ (die "$2A_{21}$") in the next row is detected;

since the die $2A_{21}$ is not a mirror die, the next die 2 at position $A_{22}$ in the +X direction is detected after the die $2A_{21}$ is picked up (in other words, the detection proceeds toward the edge 4 of the wafer 1 in accordance with the die detection and pick-up direction, and the die 2 at position $A_{22}$ is picked up); and then, the die next to (or the right side of) the die $2A_{22}$ is detected, which is a mirror die 3, when the detection locates the mirror die 3 at position $A_{23}$ ("$3A_{23}$") which is inside the reversing area H, the direction of movement with respect to the X direction is reversed, and the detection proceeds in the −X direction (or toward the left side in FIG. 1);

when this reversed detection process is executed, the wafer 1 is quick-moved from position $A_{23}$ to the die 2 at position $A_{24}$, which is located immediately at the inner side next to (or on the left side of) the die $2A_{21}$ which has been picked up, after the die 2 at position $A_{24}$, which is not a mirror die, has been detected and picked up, the dies on the same row (at positions $A_{25}$, $A_{26}$ and so on) are successively detected and picked up in the −X direction.

As seen from the above, in the detection pattern A:

dies $2A_{11}$ and $2A_{12}$ are successively detected and picked up in the die detection and pick-up process advancing in the X direction toward the outer edge 4 of the wafer 1;

when a mirror die 3 is detected at, for instance, position $A_{13}$ inside the reversing area H, the wafer is moved one pitch in the Y direction to the next row so that the die at, for instance, position $A_{21}$ in the next row is detected;

if the first die in the next row (i. e., the row containing the die $2A_{21}$) is not a mirror die, then the die 2 at, for instance, position $A_{21}$ is picked up; and dies 2 in the X direction on this row (e. g., the die $2A_{22}$ . . . ) are successively detected and picked up toward the outer edge 4; then, when a mirror die 3 at, for instance, position $A_{23}$ is detected, the direction of movement with respect to the X direction is reversed, and the die at, for instance, position $A_{24}$ located immediately next to the inner side of the first die at position $A_{21}$, is detected and picked up. Afterward, dies on the same row and at positions $A_{25}$, $A_{26}$ and so on are successively detected and picked up in the same direction as the reversed X direction.

The detection and pick-up movement pattern B (called "pattern B") taken in this embodiment is slightly different from the pattern A described above.

In the pattern B, the action by which the wafer is moved one pitch in the Y direction (or next row) when the dies 2 are detected at positions $B_{11}$ and $B_{12}$ and a mirror die 3 is detected at position $B_{13}$ is the same as the action by which the wafer is moved one pitch in the Y direction (or to next row) after detecting dies 2 at the positions $A_{11}$ and $A_{12}$ and the mirror die 3 at the position $A_{13}$. The pattern A is taken when the first die in the next row is not a mirror die 3. However, the pattern B is taken when the first die on the next row is a mirror die. In other words, when the mirror die 3 at position $B_{21}$ is detected, the direction of movement (of the die detection and pick-up) in the X direction is immediately changed (reversed), and dies 2 at positions $B_{22}$, $B_{23}$ and so on in the −X direction are successively detected and picked up as long as they are not mirror dies. If they are detected and found to be mirror dies, then these dies are not picked up, and only good dies (not mirror dies) are picked up.

As seen from the above, dies $2A_{11}$ and $2A_{12}$ or $2B_{11}$ and $2B_{12}$ are successively detected by a camera and picked up by a collet during the detection and pick-up process which proceeds in the X direction toward the outer edge 4.

When a mirror die is detected (at, for instance, position $A_{13}$ or $B_{13}$) inside the reversing area H, then the die detection and pick-up process is shifted to one pitch in the Y direction (to the next row) so that a die (at position, for example, $A_{21}$ or $B_{21}$) in the next row is detected.

If the first die in the next row is detected and found not to be a mirror die (e. g., in the case of the die 2 at, for instance, position $A_{21}$), then the detection movement pattern A is employed; on the other hand, if the first die in the next row is detected and found to be a mirror die (e. g., in the case of the die at, for instance, position $B_{21}$), then the pattern B is employed.

As to the patterns A and B, either one may be used for the detection and pick-up of dies in a direction such that the length of the chord of the round wafer 1 in the X direction increases when advancing to the next row (for example, in the upper half of the wafer in FIG. 1). However, in the case of movement in a direction such that the length of the chord of the wafer 1 in the X direction decreases when advancing to the next row (for example, in the lower half of the wafer in FIG. 1), then the detection movement pattern B is used.

Figure 2:
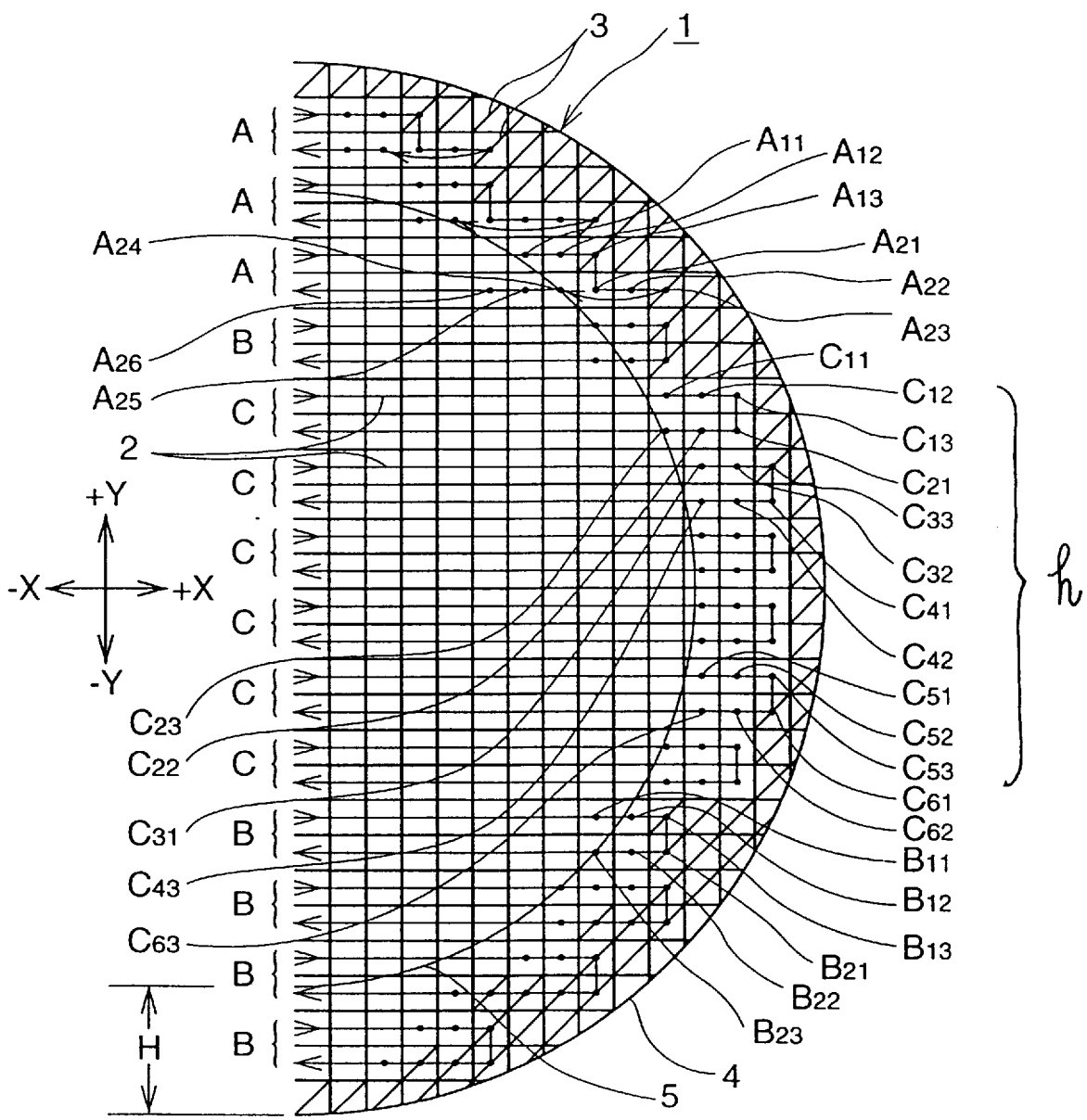
FIG. 2 is an explanatory plan view which illustrates a second embodiment of the wafer die pick-up method of the present invention.

FIG. 2 illustrates a second embodiment of the present invention. In this embodiment, a combination of three detection movement patterns which involves a detection movement pattern C in addition to the patterns A and B is used.

More specifically, the outer diameter or radius of the wafer 1 and the pitch of the dies 2 in the X direction are determined and inputted in an operational control circuit which drives the wafer in the X and Y directions in addition to the information (the reversing range from the outer edge of the wafer and the reversal die number) inputted in the first embodiment. Accordingly, based upon the outer diameter or radius of the wafer 1 and the pitch of the dies 2 in the X direction, the detection movement pattern C is used for the area h which is located in the middle portion of the wafer 1. In other words, in the area h, the length of the chord in the Y direction in the reversing area of the wafer 1 is larger than the length of the chord in the X direction in the reversing area; and in this area h, the pattern C is employed. In the areas other than the area h, the detection movement patterns which are the same as the patterns A and B are used.

More specifically, the pattern C is similar to the pattern B; however, the conditions under which the wafer is moved one pitch in the Y direction (or the conditions under which the die detection and pick-up direction is shifted to the next row) are different.

In particular, in the pattern C, the wafer is moved one pitch in the Y direction (to the next row) notwithstanding if the die detected before shifting to the next row is a mirror die or not. Furthermore, in the pattern C, the direction of detection and pick-up in the X direction on the next row is reversed from the movement of the previous row notwithstanding if the die first detected in the next row is a mirror die or not.

More specifically, in FIG. 2, dies 2 at positions $C_{11}$, $C_{12}$ and $C_{13}$ are first successively detected and picked up, the wafer is moved one pitch in the +Y direction, and then the die 2 at position $C_{21}$ in the next row is detected and picked up, the direction of movement in the X direction is reversed from the direction in the previous row, so that the dies 2 at positions $C_{22}$, $C_{23}$ and so on are detected and picked up and the direction of movement is reversed at the opposite end (not shown) of this row, if a mirror die 3 is detected at position $C_{33}$ after the dies 2 at positions $C_{31}$ and $C_{32}$ have been detected and picked up, the detection of the mirror die 3 at position $C_{33}$ causes the wafer to be moved one pitch in the Y direction to the next row;

the die 2 at position $C_{41}$ on the next row is detected and picked up, the direction of movement in the X direction is reversed from the previous row, and the dies 2 at positions $C_{42}$, $C_{43}$ and so on are detected and picked up; and after the dies 2 at positions $C_{51}$, $C_{52}$ and $C_{53}$ have been detected and picked up, the wafer is moved one pitch in the Y direction to the next row, if a mirror die 3 is detected at position $C_{61}$ in the next row, the direction of die detection and pick-up in the X direction is reversed from the previous row, and the dies 2 at positions $C_{62}$, $C_{63}$ and so on are detected and picked up.

In the above operations, the dies located on the right sides of the positions $C_{13}$, $C_{21}$, $C_{33}$, $C_{41}$, $C_{53}$ and $C_{61}$ are merely judged to be mirror dies based upon the relationship between the outer diameter or radius of the wafer 1 and the pitch of the dies 2 in the X direction which are inputted in the operational control circuit, and the detection movement pattern C is employed accordingly.

In the above-described first and second embodiments, the descriptions are made with reference to a wafer that contains mirror dies. However, the present invention is applicable to wafers containing dies resembling mirror dies, that is, dies in the peripheral areas of a wafer on which circuits are formed incompletely.

Moreover, in the above embodiments, the number of dies that causes the die detection and pick-up direction to be reversed (called "the reversing die number") is set at 1 so that the shift to the next row is executed every time one mirror die is detected. However, it is possible to set the reversing die number at 2 or greater. For example, if the reversing die number is set at 2, the shift to the next row or the reversing of the die detection and pick-up direction will be performed whenever two mirror dies are detected consecutively.

Furthermore, in the above embodiments, the X direction is the direction in which the die detection and pick-up are executed. However, it can be designed so that the Y direction is the die detection and pick-up direction.

It is also possible to add a step in which dies with a defective die shape which have been identified by inspection and marked with a "defective" mark beforehand are detected and skipped without being picked up.

As seen from the above, according to the present invention, the number of times that mirror dies (or dies resembling mirror dies) located in the peripheral area of the wafer must be detected is reduced, so that productivity is improved.

We claim:

1. A method for picking-up dies from a wafer in which a plurality of dies formed in rows on said wafer are picked up one by one by a collet, comprising:

setting up a predetermined reversing range from an outer edge of said wafer and a predetermined reversal die number, and successively detecting and picking up dies on an intended row of dies in accordance with a predetermined die detection and pick-up direction, and wherein when a die number of a defective die that is equal to said predetermined reversal die number is detected inside said predetermined reversing range, said wafer is moved one pitch so that a first die on a next row of dies on said wafer is detected, and a. in case said first die of said next row is found not to be a defective die, then dies on said next row of dies are successively detected and picked up toward an outer edge of said wafer in accordance with a die detection and pick-up direction, then, said die detection and pick-up direction is reversed and a die located immediately next to an inner side of said first die of said next row is detected and picked up when a die number of a detected defective die that is equal to said predetermined reversal die number is detected inside said predetermined reversing range, afterward, dies on said next row are successively detected and picked up in said reversed die detection and pick-up direction, and said wafer is moved one pitch toward a next row of dies at an end of said next row, and the first die of said next row is detected; and b. in case said first die of said next row is found to be a defective die, then said die detection and pick-up direction is reversed and dies on said next row are successively detected and picked up as long as said dies on said next row are not defective dies.

2. A method for picking-up dies from a wafer in which a plurality of dies formed in rows on said wafer are picked up one by one by a collet, comprising:

setting up a diameter of said wafer and a pitch in a die detection and pick-up direction in addition to a predetermined reversing range from an outer edge of said wafer and a predetermined reversal die number, and successively detecting and picking up dies on an intended row of dies in accordance with a predetermined die detection and pick-up direction, and wherein when a die number of a defective die that is equal to said predetermined reversal die number is detected inside said predetermined reversing range, said wafer is moved one pitch so that a first die on a next row of dies on said wafer is detected, and a. in case said first die of said next row is found not to be a defective die, then dies on said next row of dies are successively detected and picked up toward an outer edge of said wafer in accordance with a die detection and pick-up direction, then, said die detection and pick-up direction is reversed and a die located immediately next to an inner side of said first die of said next row is detected and picked up when a die number of a detected defective die that is equal to said predetermined reversal die number is detected inside said predetermined reversing range, afterward, dies on said next row are successively detected and picked up in said reversed die detection and pick-up direction, and said wafer is moved one pitch toward a next row of dies at an end of said next row, and the first die of said next row is detected; and b. in case said first die of said next row is found to be a defective die, then said die detection and pick-up direction is reversed and dies on said next row are successively detected and picked up as long as said dies on said next row are not defective dies; and in furtherance thereof c. said die detection and pick-up movement is merely shifted to a next row when said die detection and pick-up movement approaches said edge of said wafer notwithstanding if a die at said edge is a defective die or not; and after having shifted to said next row, said die detection and pick-up direction is reversed notwithstanding a first die detected on said next row is a defective die or not.

* * * * *